United States Patent
Asakura et al.

(10) Patent No.: US 11,404,253 B2
(45) Date of Patent: Aug. 2, 2022

(54) PLASMA PROCESSING APPARATUS AND ANALYSIS METHOD FOR ANALYZING PLASMA PROCESSING DATA

(71) Applicant: HITACHI HIGH-TECH CORPORATION, Tokyo (JP)

(72) Inventors: Ryoji Asakura, Tokyo (JP); Daisuke Shiraishi, Tokyo (JP); Akira Kagoshima, Tokyo (JP); Satomi Inoue, Tokyo (JP)

(73) Assignee: HITACHI HIGH-TECH CORPORATION, Tokyo (JP)

(*) Notice: Subject to any disclaimer, the term of this patent is extended or adjusted under 35 U.S.C. 154(b) by 0 days.

(21) Appl. No.: 16/910,533

(22) Filed: Jun. 24, 2020

(65) Prior Publication Data

US 2020/0328067 A1    Oct. 15, 2020

Related U.S. Application Data

(62) Division of application No. 15/445,203, filed on Feb. 28, 2017, now Pat. No. 10,734,207.

(30) Foreign Application Priority Data

Jul. 21, 2016   (JP) ................................ 2016-142933

(51) Int. Cl.
*H01J 37/32*   (2006.01)
*G01J 3/28*   (2006.01)
(Continued)

(52) U.S. Cl.
CPC ......... *H01J 37/32972* (2013.01); *G01J 3/027* (2013.01); *G01J 3/0264* (2013.01);
(Continued)

(58) Field of Classification Search
None
See application file for complete search history.

(56) References Cited

U.S. PATENT DOCUMENTS

| | | |
|---|---|---|
| 4,846,928 A | 7/1989 | Dolins et al. |
| 4,861,419 A | 8/1989 | Flinchbaugh et al. |
| (Continued) | | |

FOREIGN PATENT DOCUMENTS

| | | |
|---|---|---|
| JP | 2007250902 A | 9/2007 |
| JP | 2015061005 A | 3/2015 |
| (Continued) | | |

OTHER PUBLICATIONS

Office Action dated Jul. 18, 2018 for Taiwanese Patent Application No. 106102960.

(Continued)

*Primary Examiner* — Jethro M. Pence
(74) *Attorney, Agent, or Firm* — Miles & Stockbridge, P.C.

(57) ABSTRACT

According to the present invention, a plasma processing apparatus includes an analysis unit that obtains wavelengths of the light correlated with a plasma processing result, selects, from the obtained wavelengths, a wavelength having a first factor that represents a deviation in an intensity distribution of the light and is larger than a first predetermined value, and predicts the plasma processing result using the selected wavelength, or an analysis unit that obtains values computed using each of light intensities of a plurality of wavelengths and correlated with the plasma processing result, selects, from the obtained values, a value having a second factor that represents a deviation in a distribution of the obtained values and is larger than a second predetermined value, and predicts the plasma processing result using the selected value.

6 Claims, 15 Drawing Sheets

| THRESHOLD VALUE 1 | THRESHOLD VALUE 1 | THRESHOLD VALUE 1 |
|---|---|---|
| 0.8 | 0.5 | 0.5 |

(51) Int. Cl.
　　*G01J 3/02*　　　(2006.01)
　　*G01J 3/443*　　(2006.01)

(52) U.S. Cl.
　　CPC ............... *G01J 3/28* (2013.01); *G01J 3/443* (2013.01); *H01J 2237/334* (2013.01)

(56) References Cited

U.S. PATENT DOCUMENTS

| | | | |
|---|---|---|---|
| 9,324,588 | B2 | 4/2016 | Asakura et al. |
| 2003/0173028 | A1* | 9/2003 | Ikuhara ............... G01N 21/71 156/345.24 |
| 2008/0278721 | A1 | 11/2008 | Bai et al. |
| 2015/0004721 | A1 | 1/2015 | Akimoto et al. |
| 2015/0083328 | A1 | 3/2015 | Asakura et al. |

FOREIGN PATENT DOCUMENTS

| | | |
|---|---|---|
| JP | 2016025145 A | 2/2016 |
| KR | 20140119066 A | 10/2014 |

OTHER PUBLICATIONS

Kang et al. "A Comparison of Robust Parameter Estimations for Autoregressive Models" Journal of the Korean Data & Information Science Society, 2000, vol. 11, No. 1, pp. 1-18 (English translation of the abstract provided).

Office Action dated Jan. 25, 2018 for corresponding Korean Patent Application No. 10-2017-0004060.

Non Final Office Action dated Aug. 19, 2020 in corresponding U.S. Appl. No. 15/445,203.

Notice of Allowance dated Mar. 27, 2020 in corresponding U.S. Appl. No. 15/445,203.

\* cited by examiner

FIG. 6

| WAFER ID | LIGHT INTENSITY | | | |
| --- | --- | --- | --- | --- |
| | 200 nm | 200.2 nm | ... | 800 nm |
| 1 | 79.8 | 80 | ... | 77.7 |
| 2 | 80.1 | 81.2 | ... | 79.8 |
| ... | ... | ... | ... | ... |
| 100 | 81 | 81.4 | ... | 80.1 |

FIG. 7

| WAFER ID | PROCESSING RESULT FACTOR |
| --- | --- |
| 1 | 0.75 |
| 2 | 0.8 |
| ... | ... |
| 100 | 0.83 |

FIG. 10

| | 27b | 27c | 27d |
|---|---|---|---|
| | THRESHOLD VALUE 1 | THRESHOLD VALUE 1 | THRESHOLD VALUE 1 |
| | 0.8 | 0.5 | 0.5 |

| WAFER ID (28b) | LIGHT INTENSITY MONITORING VALUE CANDIDATE (28c) | | | 28d |
|---|---|---|---|---|
| | 707 nm | ... | 288 nm / 707 nm | ... |
| 1 | 912 | ... | 0.89 | ... |
| 2 | 901 | ... | 0.96 | ... |
| ... | ... | ... | ... | ... |
| 100 | 825 | ... | 1.07 | ... |

| DATA INDEX | CORRELATION COEFFICIENT | DETERMINE CORRELATION | COEFFICIENT OF VARIATION | STANDARD DEVIATION RATIO | DETERMINE COEFFICIENT OF VARIATION | DETERMINE STANDARD DEVIATION RATIO | SELECTION DATA INDEX |
|---|---|---|---|---|---|---|---|
| 707 nm | −0.46 | | | | | | |
| ... | ... | ... | ... | ... | ... | ... | ... |
| 252 nm | 0.91 | ○ | 0.044 | 0.40 | | | |
| 288 nm | 0.94 | ○ | 0.053 | 0.49 | ○ | | |
| ... | ... | ... | ... | ... | ... | ... | ... |
| 252 nm / 707 nm | 0.92 | ○ | 0.063 | 0.67 | ○ | ○ | ○ |
| 288 nm / 707 nm | 0.93 | ○ | 0.074 | 0.82 | ○ | ○ | ○ |
| ... | ... | ... | ... | ... | ... | ... | ... |

FIG. 13

| WAFER ID | LIGHT INTENSITY MONITORING VALUE | | |
|---|---|---|---|
| | 252 nm / 707 nm | 288 nm / 707 nm | ... |
| 1 | 0.78 | 0.89 | ... |
| 2 | 0.85 | 0.96 | ... |
| ... | ... | ... | ... |
| 100 | 0.92 | 1.07 | ... |

FIG. 14

| CONSTANT TERM | PREDICTION MODEL DATA INDEX | COEFFICIENT |
|---|---|---|
| 0.31 | 252 nm / 707 nm | 0.22 |
| | 288 nm / 707 nm | 0.16 |
| | ... | ... |

FIG. 17

AS RESULT OF ANALYSIS, PREDICTION MODEL HAS BEEN CREATED AS FOLLOWS.

PREDICTION MODEL

| CONSTANT TERM | PREDICTION MODEL DATA INDEX | COEFFICIENT |
|---|---|---|
| 0.31 | 252 nm / 707 nm | 0.22 |
|  | 288 nm / 707 nm | 0.16 |
|  | ... | ... |

IS APC PERFORMED USING THIS PREDICTION MODEL?  Yes / No

EVALUATION RESULT FOR CORRELATION AND DEVIATION OF DATA INDEX

| DATA INDEX | CORRELATION COEFFICIENT | COEFFICIENT OF VARIATION | STANDARD DEVIATION RATIO | SELECTION DATA INDEX |
|---|---|---|---|---|
| 252 nm | 0.91 | 0.044 | 0.40 |  |
| 288 nm | 0.94 | 0.053 | 0.49 |  |
| ... | ... | ... | ... | ... |
| 252 nm / 707 nm | 0.92 | 0.063 | 0.67 | ○ |
| 288 nm / 707 nm | 0.93 | 0.074 | 0.82 | ○ |
| ... | ... | ... | ... | ... |

PLASMA PROCESSING APPARATUS AND ANALYSIS METHOD FOR ANALYZING PLASMA PROCESSING DATA

BACKGROUND OF THE INVENTION

1. Field of the Invention

The present invention relates to a plasma processing apparatus for processing a semiconductor wafer using plasma and an analysis method for analyzing plasma processing data.

2. Description of the Related Art

In order to obtain a fine etching profile such as a semiconductor device formed on a semiconductor wafer, plasma processing is performed to remove a substance on a wafer by virtue of action of the substance (reaction on the wafer surface) by ionizing the substance (in a plasma state). Note that a size such as width or depth of the fine etching profile of the semiconductor device or an etch rate for forming the fine etching profile using the plasma processing apparatus will be referred to as a processing result factor in the following description.

In the plasma processing apparatus, it is difficult to obtain the same processing result factor due to various kinds of disturbance or a change of the plasma state depending on time even when the processing is performed under the same plasma processing condition. For this reason, in order to stabilize the processing result factor, a control technique for predicting the processing result factor using apparatus monitoring data measured during etching and changing the plasma processing condition on the basis of a result of the prediction is applied to the plasma processing apparatus. The monitoring data includes spectroscope measurement data obtained by measuring light emitted from plasma during the plasma processing or reflection light on the semiconductor wafer surface using a spectroscope.

The following method is known in the art as a method of predicting the processing result factor using the spectroscope measurement data.

JP-2007-250902-A discusses a prediction method and a prediction device for a substrate processing apparatus capable of obtaining a correlation (regression type, model) between operational data and processing result data without a significant influence from an error and thereby improving prediction accuracy in the processing result for a substrate to be processed even when the processing result data has an error.

JP-2016-25145-A discusses a technique of sequentially evaluating prediction errors generated when the etching results are predicted on the basis of the light intensity for each combination of wavelengths and time intervals using etching processing result data stored in an etching processing result data memory region 23 of a memory unit 22 and OES data stored in an OES data memory region 24, and specifying a combination of the wavelength and the time interval used in the etching result prediction.

SUMMARY OF THE INVENTION

In the method discussed in JP-2007-250902-A, a function for predicting the CD shift amount from the operational data (hereinafter, referred to as "prediction model") is created using a correlation between the operational data and the CD shift amount. In the method discussed in JP-2016-25145-A, an optimum combination of the wavelength and the time interval for use in the etching result prediction is specified on the basis of the prediction error generated when the etching result is predicted.

However, in the prediction models discussed in JP-2007-250902-A and JP-2016-25145-A, although there may be a correlation with the etching result when the prediction model is created, in some cases, the correlation may be reduced after the prediction model is created. This may spread out the prediction error. For this reason, the prediction models discussed in JP-2007-250902-A and JP-2016-25145-A fail to consider an intrinsic mechanism or property for suppressing a change influenced by a disturbance such as a change of stress or environment in a certain system, that is, robustness. Therefore, it is demanded to provide a technology for making a high correlation between the collected monitoring data and the processing result factor data and predicting the processing result factor in a newly measured monitoring data with high accuracy.

In this regard, the present invention provides a plasma processing apparatus and an analysis method, capable of making a high correlation between the collected monitoring data and the processing result factor data and predicting the processing result factor in the newly measured monitoring data with high accuracy.

According to the present invention, a plasma processing apparatus includes: a processing chamber configured to perform processing using plasma; and an analysis unit configured to analyze data of light emitted from the plasma, wherein the analysis unit obtains wavelengths of the light correlated with a plasma processing result, selects, from the obtained wavelengths, a wavelength having a first factor that represents a deviation in an intensity distribution of the light and is larger than a first predetermined value, and predicts the plasma processing result using the selected wavelength, or the analysis unit obtains values computed using each of light intensities of a plurality of wavelengths and correlated with the plasma processing result, selects, from the obtained values, a value having a second factor that represents a deviation in a distribution of the obtained values and is larger than a second predetermined value, and predicts the plasma processing result using the selected value.

In addition, according to the present invention, a method of analyzing data on light emitted from plasma, includes: a group of steps of: obtaining wavelengths of the light correlated with a plasma processing result; selecting, from the obtained wavelengths, a wavelength having a first factor that represents a deviation in an intensity distribution of the light and is larger than a first predetermined value; and predicting the plasma processing result using the selected wavelength, or a group of steps of: obtaining values computed using each of light intensities of a plurality of wavelengths and correlated with the plasma processing result; selecting, from the obtained values, a value having a second factor that represents a deviation in a distribution of the obtained values and is larger than a second predetermined value; and predicting the plasma processing result using the selected value.

According to the present invention, it is possible to make a high correlation between the collected monitoring data and the processing result factor data and predict the processing result factor in the newly measured monitoring data with high accuracy.

BRIEF DESCRIPTION OF THE DRAWINGS

FIG. 6 is a diagram illustrating a spectroscope measurement data memory region according to an embodiment of the invention;

FIG. 7 is a diagram illustrating a processing result factor data memory region according to an embodiment of the invention;

FIG. 10 is a diagram illustrating a threshold data memory region according to an embodiment of the invention;

FIG. 11 is a diagram illustrating a monitoring candidate data memory region according to an embodiment of the invention;

FIG. 12 is a diagram illustrating a correlation/deviation data memory region according to an embodiment of the invention;

FIG. 13 is a diagram illustrating a monitoring data memory region according to an embodiment of the invention;

FIG. 14 is a diagram illustrating a prediction model data memory region according to an embodiment of the invention;

FIG. 17 is a front view illustrating a screen for displaying a result of the analysis process according to an embodiment of the invention;

DESCRIPTION OF THE PREFERRED EMBODIMENTS

Figure 1:
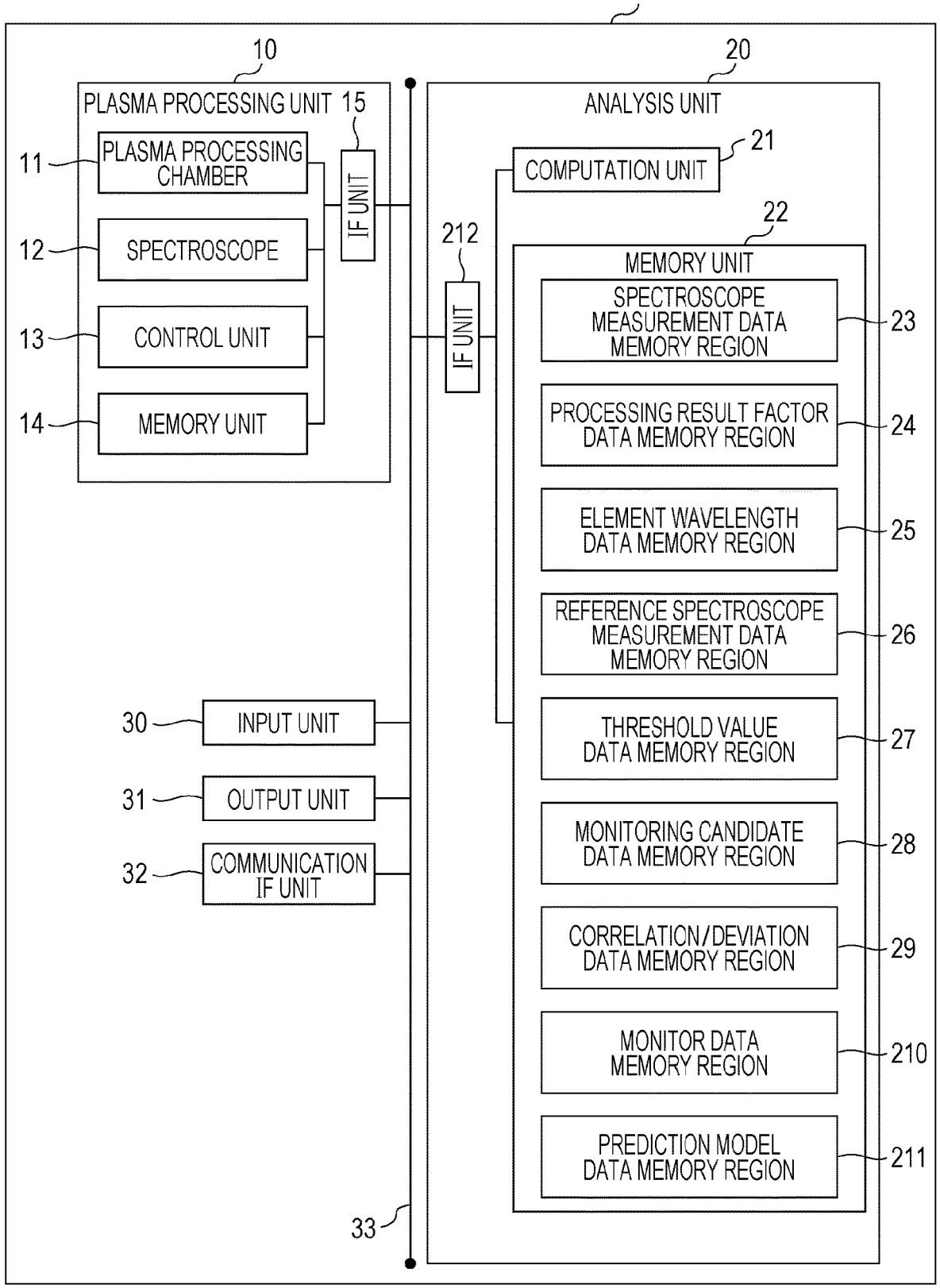
FIG. 1 is a block diagram schematically illustrating a configuration of a plasma processing apparatus according to an embodiment of the invention.

An embodiment of the present invention will now be described with reference to the accompanying drawings. Note that like reference numerals denote like elements throughout all of the drawings, and they will not be described repeatedly.

First, a plasma processing apparatus will be described. According to this embodiment, as recognized from the block diagram of the plasma processing apparatus of FIG. 1, the plasma processing apparatus 1 includes a plasma processing unit 10, an analysis unit 20, an input unit 30, an output unit 31, and a communication interface unit (communication IF unit) 32 connected to each other via a bus 33.

The plasma processing unit 10 includes a plasma processing chamber 11, a spectroscope 12, a control unit 13, a memory unit 14, and an interface (IF) unit 15. The plasma processing chamber 11 is used to generate plasma and etch a wafer. The spectroscope 12 obtains plasma light emission data during the plasma processing or spectroscope measurement data regarding reflection light on a wafer surface or a wall surface inside the plasma processing chamber. The spectroscope measurement data is stored in the memory unit 22 provided in the analysis unit 20 through the IF unit 15.

The control unit 13 controls processing in the plasma processing chamber 11. The control unit 13 performs a process of predicting the processing result factor of the plasma processing using a prediction model described below and adjusting a plasma processing condition (hereinafter, referred to as an advanced process control (APC)). The plasma processing unit 10 will be described later in more details with reference to FIG. 2. In addition, the APC process of the control unit 13 will be described later in more details with reference to FIG. 3.

The analysis unit 20 specifies a data index used in prediction of the processing result factor and creates a prediction model. The analysis unit 20 includes a computation unit 21 for analyzing data, a memory unit 22, and an interface (IF) unit 212.

The memory unit 22 has a spectroscope measurement data memory region 23 for storing a spectroscope measurement value obtained when the plasma processing is performed, a processing result factor data memory region 24 for storing a processing result factor when the plasma processing is performed, an element wavelength data memory region 25 for storing a wavelength of the light emitted from an element or compound of the plasma, a reference spectroscope measurement data memory region 26 for storing reference data for comparing deviations of the spectroscope measurement data, a threshold data memory region 27 for storing a threshold value used in determination of the analysis, a monitoring candidate data memory region 28 for storing data candidates used to create a prediction model, a correlation/deviation data memory region 29 for storing values representing a correlation coefficient between the light intensity and the processing result factor or a deviation of the light intensity, a monitoring data memory region 210 for storing data used to create the prediction model, and a prediction model data memory region 211 for storing the created prediction model. Note that the element refers to an atom, a compound, and the like.

The computation unit 21 specifies data to be used for creating a prediction model by using the spectroscope measurement data stored in the spectroscope measurement data memory region 23 of the memory unit 22, the processing result factor data stored in the processing result factor data memory region 24, the wavelength information stored in the element wavelength data memory region 25, the reference spectroscope measurement data stored in the reference spectroscope measurement data memory region 26, and the threshold value data stored in the threshold data memory region 27, creates a prediction model for predicting a result factor of the plasma processing using the specified data, and stores the prediction model in the prediction model data memory region 211. Note that the analysis process performed by the computation unit 21 will be described below in more details.

The input unit 30 is a device that receives entry of information in response to a user's operation, such as a mouse or keyboard. The output unit 31 is a display or printer that outputs information to a user. The communication IF unit 32 is an interface connected to other devices (including an inspection device for measuring the processing result factor) or systems (including an existing production management system) via a bus 33 or an external network in order to transmit or receive information.

The bus 33 connects each units and parts 10, 20, 30, 31, and 32 to each other. The IF units 15 and 212 of each parts are interfaces for transmitting or receiving information via the bus 33. Note that the analysis unit 20 may be an independent analyzer connected to the plasma processing apparatus including the plasma processing unit 10 through the IF unit 212.

Figure 2:
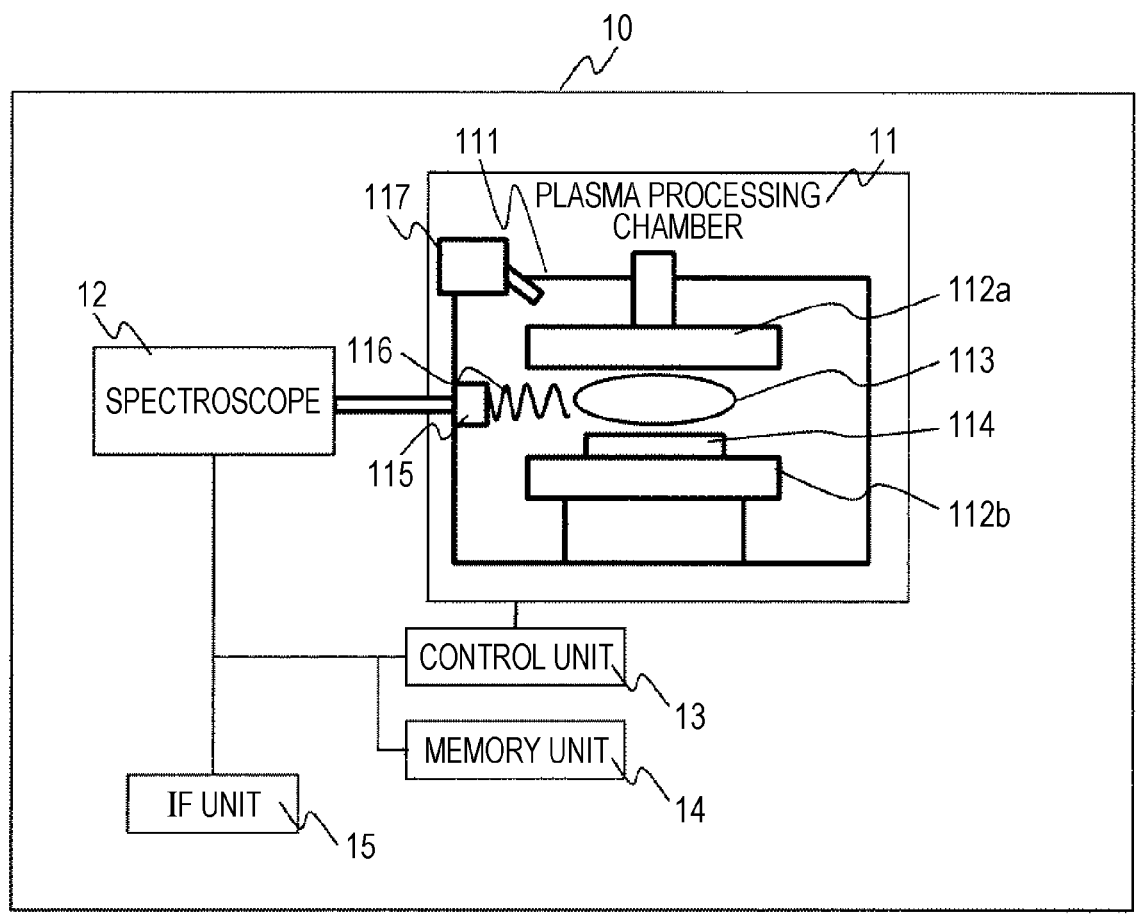
FIG. 2 is a block diagram schematically illustrating a configuration of a plasma processing unit of the plasma processing apparatus according to an embodiment of the invention.

Next, the plasma processing unit will be described. The plasma processing unit 10 includes a plasma processing chamber 11, a spectroscope 12, a control unit 13, a memory unit 14, and an IF unit 15. As illustrated in FIG. 2, the plasma processing chamber 11 has a chamber 111 having an inner space evacuated in vacuum using a vacuum evacuator (not illustrated), a pair of electrodes 112a and 112b supplied with radio frequency electric power from a power source (not illustrated) to generate plasma in the inner space of the vacuum chamber 111, a window 115 for externally inspecting the inner space of the chamber 111, and a gas feeder unit 117 that supplies the inner space of the vacuum chamber 111 with a plasma processing gas for performing plasma processing of a wafer 114. Note that the gas feeder unit 117 is capable of respectively feeding a plurality of types of gases (such as $CF_4$, $CHF_3$, or Ar).

In this configuration, in response to a command from the control unit 13, the plasma processing chamber 11 is supplied with the plasma processing gas from the gas feeder unit 117 while the wafer 114 as a sample is placed on the electrode 112b as a sample holder disposed inside the chamber 111 and the inner space of the chamber 111 is evacuated in vacuum using an evacuator (not illustrated). In addition, radio frequency electric power is applied to the electrodes 112a and 112b from a power source (not illustrated). As a result, the plasma processing gas is plasmarized between the electrodes 112a and 112b. The wafer 114 is etched by reaction of the plasmarized gas on the wafer 114.

The plasma 113 contains an element included in the plasma processing gas supplied from the gas feeder unit 117 or an element generated from the wafer 114 during the etching, so as to generate light 116 having a wavelength corresponding to the element contained in the plasmarized gas.

The generated light 116 is measured by the spectroscope 12 using the window 115, and the measurement data is stored in the spectroscope measurement data memory region 23 of the memory unit 22 of the analysis unit 20 through the IF unit 15. Note that an external light source (not illustrated) may be used to irradiate light onto the wall surface of the chamber 111 or the wafer 114 to measure reflection light or transmission light using the spectroscope 12.

The control unit 13 also performs a process of changing a recipe by using, as an input, the spectroscope measurement data generated in prediction of the processing result factor described below and control of the plasma processing condition (APC) and measured by the spectroscope 12 in addition to the control of the plasma processing chamber 11. The memory unit 14 stores a copy of the data stored in the prediction model data memory region 211 described below as a computation formula for computing the prediction value of the processing result factor.

After the plasma processing is completed, the wafer 114 subjected to the processing is exported from the chamber 111 and is delivered to other devices such as an inspection device. In addition, another new wafer 114 is imported into the plasma processing unit 10, and plasma processing is performed. For the wafer 114 subjected to the processing, measurement is performed for a dimension of the pattern obtained as a result of the plasma processing using other devices such as an inspection device. The dimension of the pattern or the like is stored in the processing result factor data memory region 24 of the memory unit 22 as processing result factor data.

Figure 5:
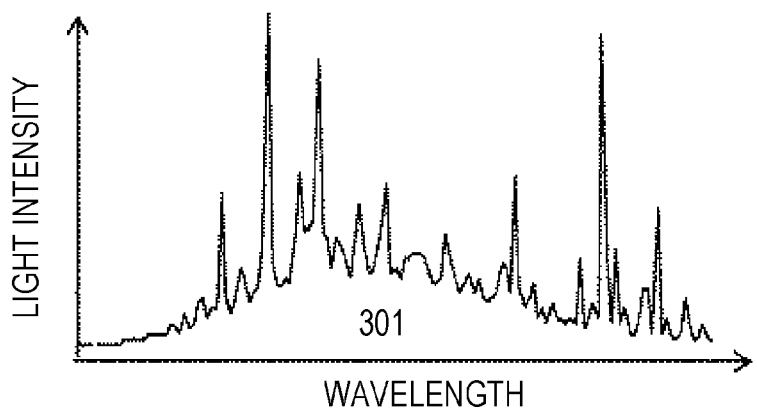
FIG. 5 is a graph describing time-averaged spectroscope measurement data.

Next, the spectroscope measurement data will be described. FIG. 5 shows a waveform signal 301 as an example of the spectroscope measurement data of the plasma light emission measured by the spectroscope 12. The waveform signal 301 of the spectroscope measurement data has a two-dimensional component including wavelength and time and represents values of the light intensities measured at each timing for each wavelength.

Figure 4:
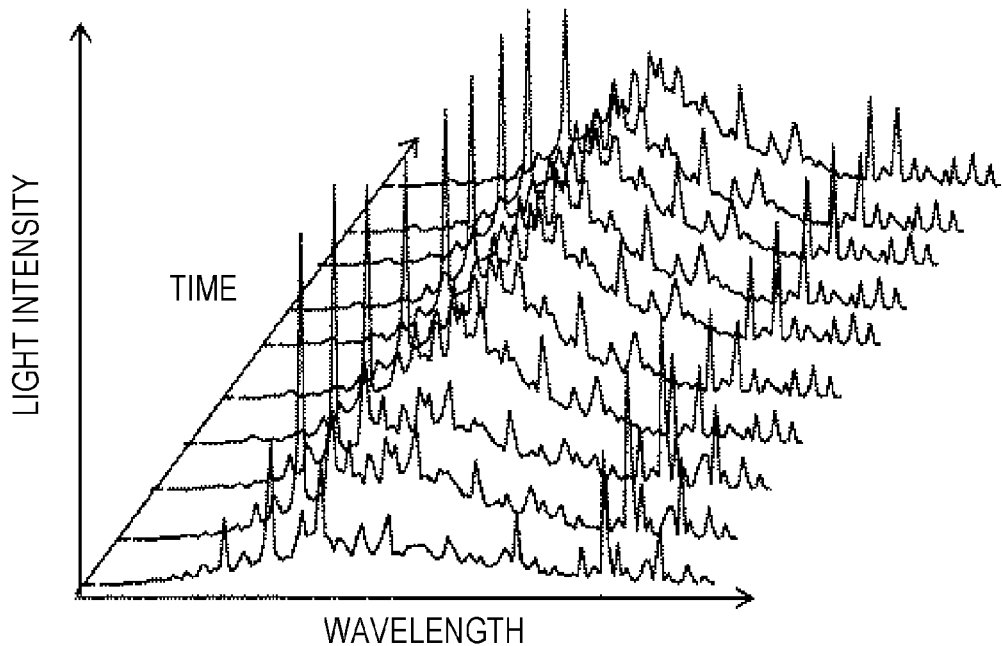
FIG. 4 is a graph describing spectroscope measurement data.

FIG. 4 shows an example of a time average of the light intensities measured for each wavelength of the spectroscope measurement data. The time average may be calculated, for example, for a time from the start to the end of the plasma processing using a predetermined plasma processing gas. The average value of the spectroscope measurement data is stored in the spectroscope measurement data memory region 23 described below along with the wafer ID of the measured wafer. Note that the value stored in the spectroscope measurement data memory region 23 is not limited to an average value for a time interval, but also includes a maximum, minimum, or median value.

Figure 3:
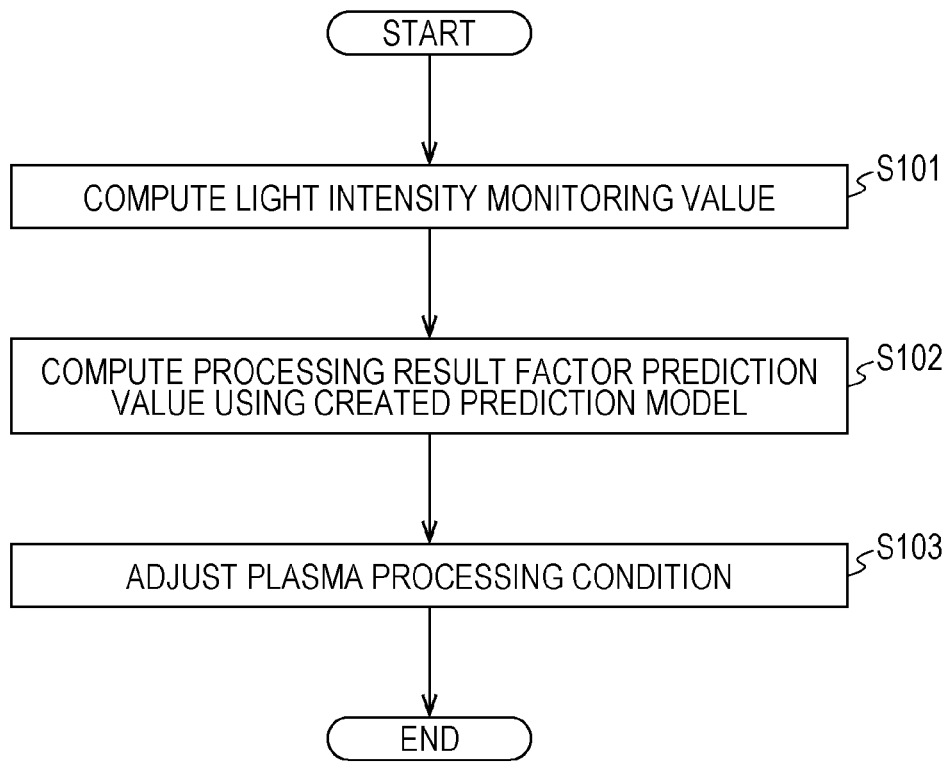
FIG. 3 is a flowchart illustrating a process of predicting and controlling a processing result factor according to an embodiment of the invention.

Next, a control of the plasma processing condition using the APC will be described. FIG. 3 illustrates an exemplary APC process performed by the control unit 13. If the plasma processing apparatus is set to execute the APC as soon as the wafer plasma processing is completed, the control unit 13 computes an average of the light intensities of the spectroscope measurement data obtained by measuring a wavelength or a combination of wavelengths designated by the prediction model stored in the memory unit 14 using the spectroscope 12. Alternatively, the control unit 13 computes a value obtained by dividing an average of the light intensity by an average of other light intensities (step S101). Hereinafter, the average of the light intensity or the value obtained by dividing the average of the light intensity by the average of other light intensities will be referred to as a light intensity monitoring value. Note that the maximum, minimum, or median value of the light intensity may also be referred to as the light intensity monitoring value.

Then, the control unit 13 computes a prediction value of the processing result factor by applying a coefficient designated in the prediction model stored in the memory unit 14 to the light intensity monitoring value (step S102). Furthermore, the control unit 13 adjusts the plasma processing condition on the basis of a difference between the prediction value of the processing result factor and the target value (step S103). As the plasma processing condition, for example, a flow rate of the plasma processing gas (gas flow rate) supplied from the gas feeder unit 117 is adjusted. In step S103, in addition to the adjustment of the plasma processing condition, an alarm may be notified to alarm abnormality when the difference between the prediction value of the processing result factor and the target value is larger than a predetermined threshold value.

Next, the analysis unit will be described. As illustrated in FIG. 1, the analysis unit 20 has a computation unit 21, a memory unit 22, and an IF unit 212. The memory unit 22 has a spectroscope measurement data memory region 23, a processing result factor data memory region 24, an element wavelength data memory region 25, a reference spectroscope measurement data memory region 26, a threshold data memory region 27, a monitoring candidate data memory region 28, a correlation/deviation data memory region 29, a monitoring data memory region 210, and a prediction model data memory region 211.

The spectroscope measurement data memory region 23 stores information for specifying the spectroscope measurement data measured by the spectroscope 12 for each wafer during the plasma processing. FIG. 6 illustrates a spectroscope measurement data table 23a as an example of the spectroscope measurement data memory region 23. This table has respective fields such as a wafer ID column 23b and a light intensity column 23c. Information for identifying the wafer 114 is stored in the wafer ID column 23b. The values stored in the wafer ID column 23b match with the values stored in the wafer ID column 24b of the processing result factor data table 24a described below in order to allow the spectroscope measurement data obtained when plasma processing is performed for each wafer and the processing result factor to match with each other.

Information for specifying the spectroscope measurement data measured by the spectroscope 12 is stored in the light intensity column 23c. The field of the light intensity column 23c is divided for each wavelength as illustrated as reference numeral 23d in FIG. 6. A value obtained by averaging the light intensities of each wavelength across the plasma processing time is stored in each field. In addition, each row matches with the wafer ID used to measure the spectroscope measurement data thereof.

Note that the stored spectroscope measurement data may be spectroscope measurement data obtained when the plasma processing is performed to etch the wafer or spectroscope measurement data obtained when the plasma processing is performed to recover a condition of the plasma processing chamber 11 before the wafer etching. Alternatively, the stored value may be a maximum, minimum, or median value instead of the average value of the light intensity across the plasma processing time. Alternatively, the stored value may be a light intensity at a certain designated time, such as a light intensity in the middle of the plasma processing.

Information for specifying a result of the plasma processing for each wafer is stored in the processing result factor data memory region 24. FIG. 7 illustrates a processing result factor data table 24a as an example of the processing result factor data memory region 24. This table has respective fields such as a wafer ID column 24b and a processing result factor column 24c. Information for identifying the wafer 114 is stored in the wafer ID column 24b. The value stored in the wafer ID column 24b matches with the value stored in the wafer ID column 23b of the spectroscope measurement data table 23a. Information for specifying the result of the plasma processing is stored in the processing result factor column 24c.

A measurement result obtained by measuring a surface shape of the wafer 114 identified by the wafer ID column 23b using a measurement device connected to the plasma processing apparatus 1 after the plasma processing (for example, a dimension of the pattern or a clearance between the patterns formed on the wafer 114 and measured using a measurement device such as a length measurement scanning electron microscope (SEM) or an optical measurement device) is stored in the processing result factor column 24c. Dimension information on the surface shape is stored in the processing result factor data memory region 24 for each wafer through the communication IF unit 32. In addition, when the plasma processing condition is adjusted for each wafer, a change amount of the processing result factor may be computed on the basis of the adjustment amount of the plasma processing condition using a correlation function between the plasma processing condition adjustment amount and the processing result factor change amount, and a value obtained by correcting the measured processing result factor on the basis of the processing result factor change amount may be stored in the processing result factor data memory region 24.

Figure 8:
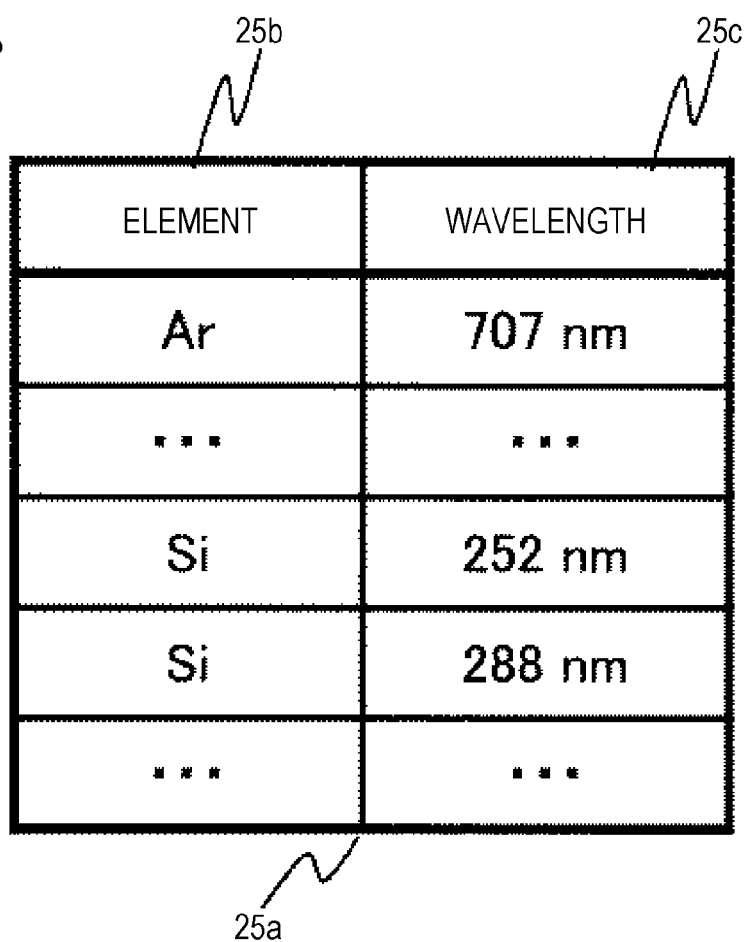
FIG. 8 is a diagram illustrating an element wavelength data memory region according to an embodiment of the invention.

Information for specifying a wavelength of the light emitted from an element contained in the plasma is stored in the element wavelength data memory region 25. FIG. 8 illustrates an element wavelength data table 25a as an example of the element wavelength data memory region 25. This table has respective fields such as an element column 25b and a wavelength column 25c. Information for specifying a candidate of the element (such as an atom or compound) contained in the plasma is stored in the element column 25b. Information for specifying the wavelength of the light emitted from the element is stored in the wavelength column 25c.

Spectroscope measurement data not matching with the processing result factor data as a reference value of the spectroscope measurement data is stored in the reference spectroscope measurement data memory region 26 for each wafer. The stored spectroscope measurement data includes, for example, spectroscope measurement data obtained by performing the plasma processing for a wafer on which measurement of the processing result factor is not possible because a sampling measurement is performed, or spectroscope measurement data obtained by performing plasma processing for a dummy wafer on which measurement of the processing result factor such as a dimension is not possible. Note that the stored data may include spectroscope measurement data measured by a plasma processing apparatus other than the plasma processing apparatus 1.

Figure 9:
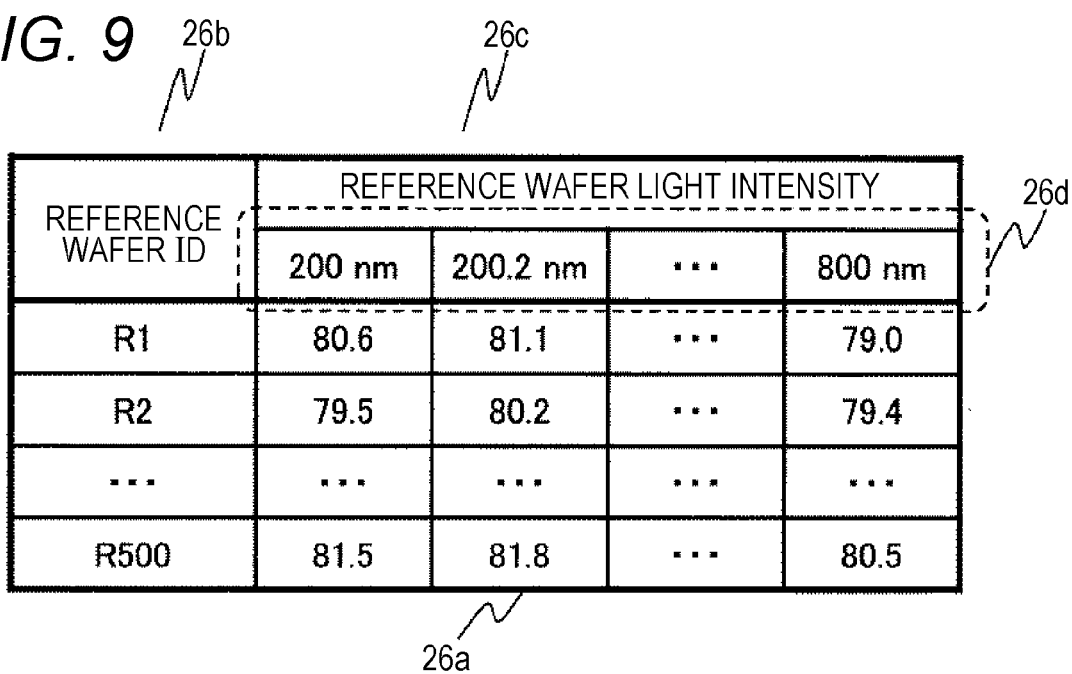
FIG. 9 is a diagram illustrating a reference spectroscope measurement data memory region according to an embodiment of the invention.

FIG. 9 shows a reference spectroscope measurement data table 26a as an example of the reference spectroscope measurement data memory region 26. This table has respective fields such as a reference wafer ID column 26b and a reference wafer light intensity column 26c. Information for identifying the wafer 114 is stored in the reference wafer ID column 26b. Information for specifying the spectroscope measurement data measured by the spectroscope 12 is stored in the reference wafer light intensity column 26c. The fields of the reference wafer light intensity column 26c are divided for each wavelength as illustrated in reference numeral 26d of FIG. 9, and a value obtained by averaging the light intensities for each wavelength across the plasma processing time is stored in each field.

Each row matches with the wafer ID for which the spectroscope measurement data is measured. A computation value of the light intensity matching with the light intensity column 23c of the spectroscope measurement data table 23a is stored in the reference wafer light intensity column 26c. For example, when the spectroscope measurement data obtained by performing plasma processing for fabricating the wafer is stored in the light intensity column 23c, the same spectroscope measurement data is also stored in the reference wafer light intensity column 26c. When the spectroscope measurement data obtained by performing plasma processing to recover a condition of the plasma processing chamber 11 before etching of the wafer is stored in the light intensity column 23c, the same spectroscope measurement data is also stored in the reference wafer light intensity column 26c. Information for specifying the threshold value used in the analysis process described below is stored in the threshold data memory region 27.

FIG. 10 illustrates a threshold value data table 27a as an example of the threshold data memory region 27. This table has respective fields such as a first threshold value column 27b, a second threshold value column 27c, and a third threshold value column 27d. The threshold value used to determine the correlation coefficient in the analysis process described below is stored in the first threshold value column 27b. The threshold value used to determine the coefficient of variation in the analysis process described below is stored in the second threshold value column 27c. In addition, the threshold value used to determine the standard deviation ratio in the analysis process described below is stored in the third threshold value column 27d. Information for specifying the light intensity monitoring value for the data index candidate used to create the prediction model is stored in the monitoring candidate data memory region 28.

FIG. 11 illustrates a monitoring candidate data table 28a as an example of the monitoring candidate data memory region 28. This table has respective fields such as a wafer ID column 28b and a light intensity monitoring value candidate column 28c. Information for identifying the wafer 114 is stored in the wafer ID column 28b. The value stored in the wafer ID column 28b matches with the value stored in the wafer ID column 23b of the spectroscope measurement data table 23a described above. Therefore, the value stored in the wafer ID column 28b matches with the value stored in the wafer ID column 24b of the processing result factor data table 24a.

A value stored for a specific wavelength in the light intensity column 23c of the spectroscope measurement data table 23a or a ratio of values stored for a plurality of wavelengths is stored in the light intensity monitoring value candidate column 28c. The fields of the light intensity monitoring value candidate column 28c are divided for each data index as illustrated in reference numeral 28d of FIG. 11, and each field indicates a wavelength or a ratio of a plurality of wavelengths. For example, the light intensities of each wafer at a wavelength of 707 nm are stored in the column of "707 nm." In addition, values obtained by dividing the light intensities at a wavelength of 288 nm by the light intensities at the wavelength of 707 nm in each wafer are stored in the "288/707 nm" column Note that the stored value may be a maximum value or an average value of the light intensity within a predetermined range (longer or shorter than several nanometers) with respect to a selected wavelength.

Information for specifying a correlation between the light intensity monitoring value and the processing result factor data for each data index (a wavelength or a combination of wavelengths) for calculating the light intensity monitoring value, or information for specifying a deviation of the light intensity monitoring value and information for specifying a result of evaluation obtained by evaluating the data index with the correlation or the deviation are stored in the correlation/deviation data memory region 29. FIG. 12 illustrates a correlation/deviation data table 29a as an example of the correlation/deviation data memory region 29. This table has respective fields such as a data index column 29b, a correlation coefficient column 29c, a correlation determination column 29d, a coefficient-of-variation column 29e, a standard deviation ratio column 29f, a coefficient-of-variation determination column 29g, a standard deviation ratio determination column 29h, and a selection data index column 29i.

Information for specifying a wavelength or a plurality of wavelengths for computing the light intensity monitoring value is stored in the data index column 29b. Each row of the data index column 29b matches with each column of the light intensity monitoring value candidate column 28c of the monitoring candidate data table 28a. Information for specifying a correlation coefficient between the processing result factor data and the light intensity monitoring value specified in the data index column 29b is stored in the correlation coefficient column 29c. Information for specifying a data index for which the correlation coefficient stored in the correlation coefficient column 29c is greater than a predetermined threshold value is stored in the correlation determination column 29d. Information for specifying a coefficient of variation of the light intensity monitoring value specified in the data index column 29b is stored in the coefficient-of-variation column 29e.

Information for specifying the standard deviation ratio of the light intensity monitoring value specified in the data index column 29b is stored in the standard deviation ratio column 29f. Information for specifying a data index for which the coefficient of variation stored in the coefficient-of-variation column 29e is greater than a predetermined threshold value is stored in the coefficient-of-variation determination column 29g. Information for specifying a data index for which the standard deviation ratio stored in the standard deviation ratio column 29f is greater than a predetermined threshold value is stored in the standard deviation ratio determination column 29h. Information for specifying a data index used to create the prediction model out of data indices stored in the data index column 29b is stored in the selection data index column 29i. Information for specifying the light intensity monitoring value used to create the prediction model is stored in the monitoring data memory region 210.

FIG. 13 illustrates a monitoring data table 210a as an example of the monitoring data memory region 210. This table has respective fields such as a wafer ID column 210b and a light intensity monitoring value column 210c. Information for identifying the wafer 114 is stored in the wafer ID column 210b. The value stored in the wafer ID column 210b matches with the wafer ID column 28b of the monitoring candidate data table 28a described above. A value stored for a particular wavelength in the light intensity column 23c of the spectroscope measurement data table 23a or a ratio of the values stored for a plurality of wavelengths is stored in the light intensity monitoring value column 210c.

The light intensity monitoring value column 210c is divided into fields for each data index as illustrated in reference numeral 210d of FIG. 13, and each field indicates a wavelength or a combination of wavelengths. Out of the data indices of the light intensity monitoring value candidate column 28c of the monitoring candidate data table 28a described above, the light intensity monitoring value corresponding to the data index selected in the analysis process described below is stored in these fields. Information for specifying the coefficient or the data index of the created prediction model is stored in the prediction model data memory region 211.

FIG. 14 illustrates a prediction model data table 211a as an example of the prediction model data memory region 211. This table has respective fields such as a constant term column 211b, a prediction model data index column 211c, and a coefficient column 211d. Information for specifying a constant term (intercept) of the prediction model is stored in the constant term column 211b. Information for specifying a wavelength or a combination of wavelengths for computing the light intensity monitoring value is stored in the prediction model data index column 211c. The stored information is the data index selected in the analysis process described below and matches with the information stored in the selection data index column 29i of the correlation/deviation data table 29a.

Information for specifying a coefficient applied to the light intensity monitoring value computed using the wavelength or the combination of wavelengths stored in the prediction model data index column 211c is stored in the coefficient column 211d. A sum of the information stored in the constant term column 211b and the value obtained by applying the coefficient of the coefficient column 211d to the light intensity monitoring value is used as the prediction value of the processing result factor data.

Next, an analysis process of the analysis unit 20 will be described. A method of the analysis process according to this embodiment is an analysis method of specifying a data index (a wavelength or a combination of wavelengths) of the spectroscope measurement data for predicting the processing result factor in the plasma processing for processing a wafer using plasma. In the method of the analysis process according to this embodiment, a coefficient of variation and a standard deviation ratio representing a degree of the correlation between the light intensity monitoring value and the processing result factor and a degree of the deviation of the light intensity monitoring value are evaluated for each data index of the spectroscope measurement data, and the data index used to predict the processing result factor is specified, in order to create a prediction model for predicting the processing result factor. The method of analysis process according to this embodiment will now be described in more details.

Figure 15:
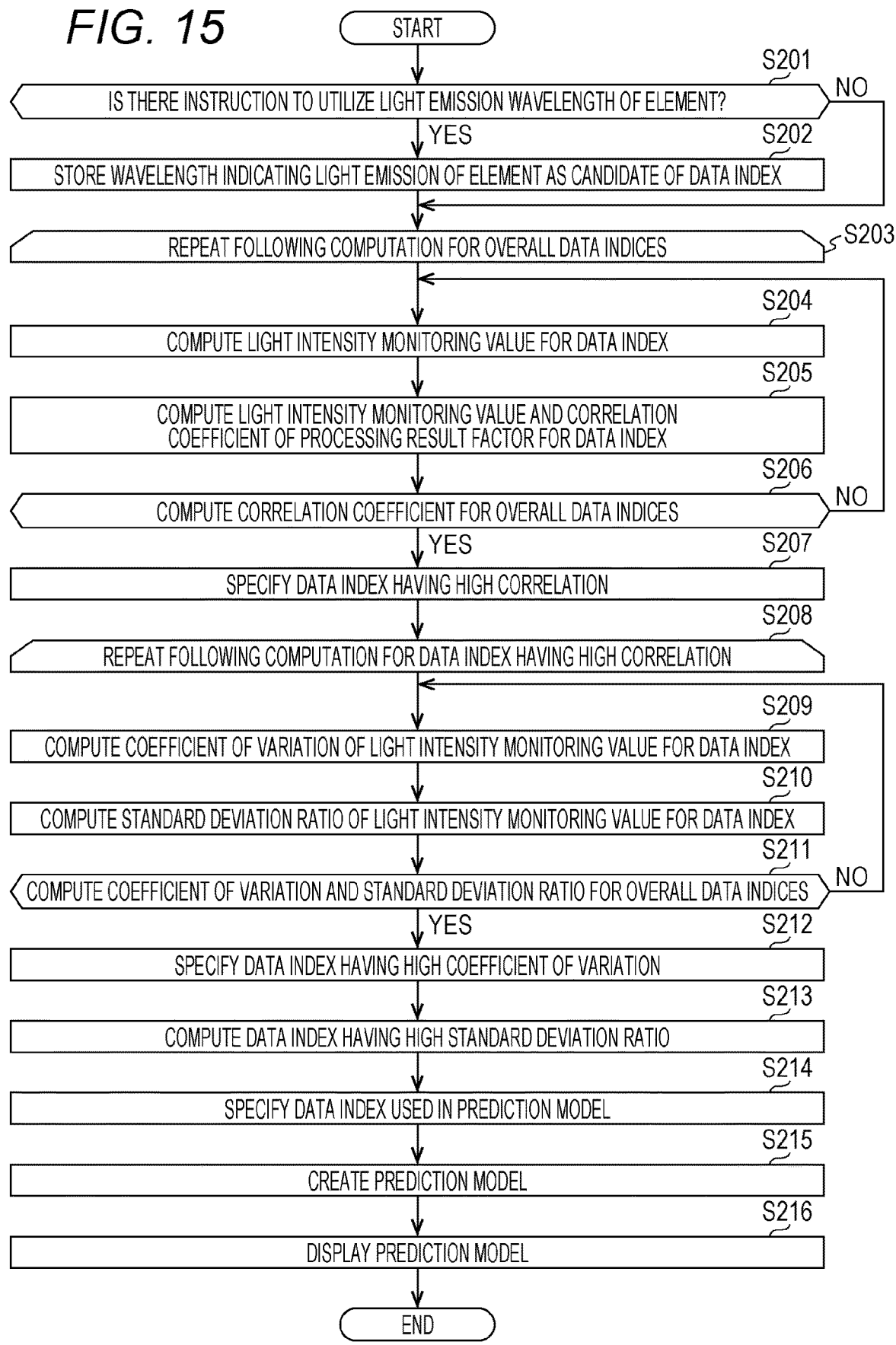
FIG. 15 is a flowchart illustrating an analysis process sequence in a computation unit according to an embodiment of the invention.

In a production process, before the plasma processing, an apparatus manager of the plasma processing apparatus 1 executes the analysis process of the analysis unit 20 sequentially for a plurality of wafers using the plasma processing apparatus 1 in order to create the prediction model used to predict the processing result factor. The prediction model is changed depending on a film structure on the wafer surface as a plasma processing target. Therefore, it is necessary to appropriately execute this analysis process when the plasma processing starts. In the production process (mass production process), a plurality of wafers are sequentially subjected to plasma processing using the plasma processing apparatus 1 under the plasma processing condition determined in this analysis process. Next, a flow of the analysis process executed by the analysis unit 20 will be described with reference to FIG. 15.

Figure 16:
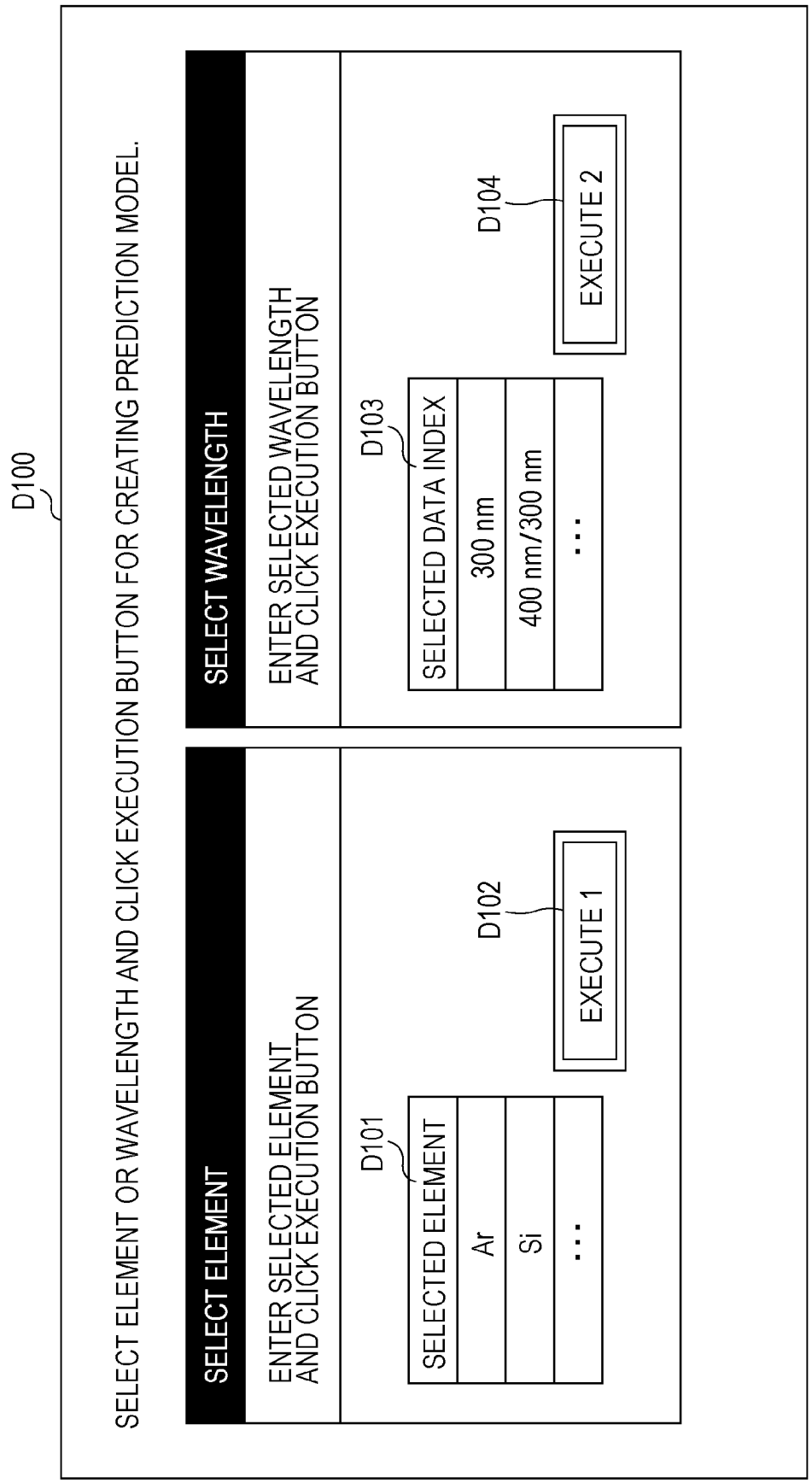
FIG. 16 is a front view illustrating a screen for instructing execution of the analysis process according to an embodiment of the invention.

When an apparatus manager instructs execution of the analysis process on the display screen D100 illustrated in FIG. 16, the analysis unit 20 executes the analysis process. When the prediction model is created by selecting an element for the first time (YES in step S201), the wavelength and the combination of wavelengths exciting light emission of the selected element is stored in the correlation/deviation data memory region 29 as the data index used to compute the light intensity monitoring value (step S202). When the prediction model is created by selecting the wavelength, the wavelength selected by the apparatus manager is stored in the correlation/deviation data memory region 29 as the data index (NO in step S201).

Then, the light intensity monitoring value is computed for each stored data index, and a correlation coefficient between the light intensity monitoring value and the processing result factor data is computed (steps S203 to S206), so that data indices having a high correlation are specified (step S207). For each data index having a high correlation, a coefficient of variation and a standard deviation ratio are computed as an indicator for indicating a deviation of the light intensity monitoring value (steps S208 to S211). In addition, a data index having a high coefficient of variation and a data index having a high standard deviation ratio as a result of the computation are specified (steps S212 and S213), and the data index having both the high values (the data index having a large deviation of the light intensity monitoring value) is specified as the data index used in the prediction model (step S214).

A prediction model is created using the light intensity monitoring value and the processing result factor data in the specified data index (step S215), and the created prediction model is submitted to the apparatus manager on the display screen D200 (step S216), so that the analysis process is completed. Next, each step will be described in more details.

In step S201, the computation unit 21 starts the analysis process when an apparatus manager enters an element for computing a wavelength into the SELECTED ELEMENT box D101 on the display screen D100 of FIG. 16 and clicks the EXECUTE 1 button D102, or when an apparatus manager enters a wavelength or a combination of wavelengths into the SELECTED DATA INDEX box D103 and clicks the EXECUTE 2 button D104. The process of the computation unit 21 advances to the next step S202 when the EXECUTE 1 button D102 is clicked, that is, when the analysis process is executed by selecting the element. In addition, when the EXECUTE 2 button D104 is clicked, that is, when the analysis process is executed by selecting a wavelength, the information stored in the SELECTED DATA INDEX box D103 is stored in the data index column 29b of the correlation/deviation data table 29a, and the process advances to step S203.

In step S202, the computation unit 21 creates information stored in the data index column 29b of the correlation/deviation data table 29a using the element information. The computation unit 21 specifies the corresponding element for the element column 25b of the element wavelength data table 25a using the element information stored in the SELECTED ELEMENT box D101 and obtains entire information of the wavelength column 25c stored for the same row as that of this element. For the obtained wavelengths, a combination for obtaining a wavelength ratio (for example, 252 nm/707 nm) is created, and the information on the obtained wavelength and the created combination of wavelength is stored in the data index column 29b of the correlation/deviation data table 29a. In step S203, the computation unit 21 executes the following steps S204 and S205 for each data index stored in the data index column 29b of the correlation/deviation data table 29a.

In step S204, the computation unit 21 obtains the light intensity selected by the wavelength of the light intensity column 23c of the spectroscope measurement data table 23a for each wafer ID using the information on the wavelength or the combination of wavelengths stored in the data index column 29b, and stores the obtained value in the light intensity monitoring value candidate column 28c of the monitoring candidate data table 28a as the light intensity monitoring value. In addition, the data index (wavelength or combination of wavelengths) is also stored in the light intensity monitoring value candidate column 28c. Furthermore, when the data index is the combination of wavelengths, a value obtained by dividing a light intensity at a single selected wavelength by a light intensity at another selected wavelength is stored in the light intensity monitoring value candidate column 28c as the light intensity monitoring value.

In step S205, the computation unit 21 computes a correlation coefficient as information indicating a magnitude of the correlation between the light intensity monitoring value and the processing result factor using the following Equation (1).

[Equation 1]

$$cr = \sum_{i=1}^{n} (e_i - me)(r_i - mr) \bigg/ \left\{ \sum_{i=1}^{n} (e_i - me)^2 \sum_{i=1}^{n} (r_i - mr)^2 \right\}^{1/2} \quad (1)$$

In this equation, reference symbol "cr" denotes a correlation coefficient. Reference symbol "$e_i$" denotes the (i)th light intensity monitoring value (the value stored in the (i)th row of the data index of the light intensity monitoring value candidate column 28c). Reference symbol "$r_i$" denotes a value stored in the (i)th row of the processing result factor data column 24b of the processing result factor data table 24a.

Reference symbol "me" denotes an average value of the light intensity monitoring value. Reference symbol "mr" denotes an average value of the values stored in the processing result factor data column 24b. Reference symbol "n" denotes the number of rows of the processing result factor data table 24a and the monitoring candidate data table 28a. Reference symbol "Σ" denotes a summation throughout overall rows of the processing result factor data table 24a and the monitoring candidate data table 28a. The computation unit 21 stores the computed correlation coefficient (cr) in the row of the corresponding data index of the correlation coefficient column 29c of the correlation/deviation data table 29a.

In step S206, the process of the computation unit 21 advances to step S207 if the correlation coefficient is computed for overall data indices. If a data index not subjected to the computation remains, steps S204 and S205 are executed again. In step S207, the computation unit 21 specifies a data index having a high correlation by referring to the correlation coefficient column 29c of the correlation/deviation data table 29a. The computation unit 21 compares an absolute value of the value stored in the correlation coefficient column 29c and a value stored in the first threshold value column 27b of the threshold value data table 27a for each row of the correlation/deviation data table 29a. If the absolute value of the value stored in the correlation coefficient column 29c is greater, a symbol "○" is inserted into the correlation determination column 29d of the corresponding row to indicate a high correlation.

Note that the threshold value for determining whether or not the correlation is high may be corrected on the basis of the number of wafers (the number of rows in the monitoring candidate data table 28a) such that it increases as the number of wafers is reduced. Alternatively, although whether or not the correlation is high is determined on the basis of the absolute value according to this embodiment, the correlation may be determined using correlation verification, and the symbol "○" may be inserted when it is determined that there is a correlation. In step S208, the computation unit 21 executes the following steps S209 and S210 for each data index determined to have a high correlation.

In step S209, the computation unit 21 computes the coefficient of variation serving as a value indicating a magnitude of the deviation of the light intensity monitoring value by dividing the standard deviation of the light intensity monitoring value by the average value using the following Equation (2) for the data index determined to have a high correlation, that is, the data index for which the symbol "○" is stored in the correlation determination column 29d of the correlation/deviation data table 29a.

[Equation 2]

$$cv = \left\{ \sum_{i=1}^{n} (e_i - me)^2 / (n-1) \right\}^{1/2} \times 1/me \quad (2)$$

In Equation (2), reference symbol "cv" denotes a coefficient of variation. Reference symbol "$e_i$" denotes the (i)th value of the light intensity monitoring values (the value stored in the (i)th row of the corresponding data index of the light intensity monitoring value candidate column 28c). Reference symbol "me" denotes the average value of the light intensity monitoring value. Reference symbol "n" denotes the number of rows in the monitoring candidate data table 28a. Reference symbol "Σ" denotes a summation throughout overall rows of the monitoring candidate data table 28a. The computation unit 21 stores the computed coefficient of variation (cv) in the row of the corresponding data index of the coefficient-of-variation column 29e of the correlation/deviation data table 29a. Note that the coefficient of variation may be computed using a median value instead of the average value me in Equation (2).

In step S210, the computation unit 21 computes the standard deviation ratio serving as a value indicating a magnitude of the deviation of the light intensity monitoring value by dividing the standard deviation of the light intensity monitoring value by the standard deviation of the light intensity monitoring value computed from the spectroscope measurement data of the reference wafer for the data index determined to have a high correlation, that is, the data index for which the symbol "○" is stored in the correlation determination column 29d of the correlation/deviation data table 29a using the following Equation (3).

[Equation 3]

$$sr = \left\{ \sum_{i=1}^{n} (e_i - me)^2 / (n-1) \right\}^{1/2} \times \left\{ (m-1) \bigg/ \sum_{i=1}^{m} (re_i - mre)^2 \right\}^{1/2} \quad (3)$$

In Equation (3), reference symbol "sr" denotes a standard deviation ratio. Reference symbol "$e_i$" denotes the (i)th value of the light intensity monitoring values (the value stored in the (i)th row of the corresponding data index of the light intensity monitoring value candidate column 28c). Reference symbol "me" denotes the average value of the light intensity monitoring value. Reference symbol "n" denotes the number of rows in the monitoring candidate data table 28a. Reference symbol "$re_i$" denotes the (i)th value of the light intensity monitoring values computed from the wavelength or the combination of wavelengths selected by the corresponding data index for the reference wafer light intensity column 26c of the reference spectroscope measurement data table 26a (the value computed for the (i)th row of the reference wafer light intensity column 26c).

Reference symbol "mre" denotes an average value of the values "re$_i$." Reference symbol "m" denotes the number of rows of the reference spectroscope measurement data table 26a. Reference symbol "Σ" denotes a summation throughout overall rows of the monitoring candidate data table 28a or the reference spectroscope measurement data table 26a. The computation unit 21 stores the computed standard deviation ratio (sr) in the row of the corresponding data index of the standard deviation ratio column 29f of the correlation/deviation data table 29a. Note that the standard deviation ratio may be computed using a median value instead of the average value "me" or "mre" in Equation (3).

In step S211, the process advances to step S212 if the computation unit 21 computes the coefficient of variation and the standard deviation ratio for overall data indices determined to have a high correlation. If a data index not subjected to the computation still remains, the computation unit 21 executes steps S209 and S210 again. In step S212, the computation unit 21 specifies a data index having a high coefficient of variation by referring to the coefficient-of-variation column 29e of the correlation/deviation data table 29a. The computation unit 21 ranks the values stored in the coefficient-of-variation column 29e in descending order for the rows of the correlation/deviation data table 29a subjected to the computation of the coefficient of variation, that is, the rows determined to have a high correlation, and computes a ratio of the number of rows determined to have a high correlation and the rank for each data index. If the ratio is lower than the value stored in the second threshold value column 27c of the threshold value data table 27a, the symbol "○" indicating a high coefficient of variation is inserted into the coefficient-of-variation determination column 29g of the corresponding row. Through this process, the symbol "○" is inserted into the data index having a relatively high coefficient of variation out of the data indices determined to have a high correlation.

Note that, as a method of determining the coefficient of variation, the following method may be employed. Specifically, a value for comparing the coefficient of variation is stored in the second threshold value column 27c. For each row of the correlation/deviation data table 29a, the value stored in the coefficient-of-variation column 29e is compared with the value stored in the second threshold value column 27c. If the value stored in the coefficient-of-variation column 29e is greater, the symbol "○" indicating a high coefficient of variation is inserted into the coefficient-of-variation determination column 29g of the corresponding row.

In step S213, the computation unit 21 specifies the data index having a high standard deviation ratio by referring to the standard deviation ratio column 29f of the correlation/deviation data table 29a. The computation unit 21 ranks the values stored in the standard deviation ratio column 29f in descending order for the rows of the correlation/deviation data table 29a subjected to the computation of the standard deviation ratio, that is, the rows determined to have a high correlation, and computes a ratio of the number of rows determined to have a high correlation and the rank for each data index. For the rows for which the ratio is lower than the value stored in the third threshold value column 27d of the threshold value data table 27a, the symbol "○" indicating a high standard deviation ratio is inserted into the standard deviation ratio determination column 29h of the corresponding row. Through this process, the symbol "○" is inserted into the data index having a relatively high standard deviation ratio out of the data indices determined to have a high correlation.

Note that, as a method of determining the standard deviation ratio, the following method may be employed. Specifically, a value for comparison with the value of the standard deviation ratio is stored in the third threshold value column 27d, and the value stored in the standard deviation ratio column 29f and the value stored in the third threshold value column 27d are compared with each other for each row of the correlation/deviation data table 29a. If the value stored in the standard deviation ratio column 29f is greater, the symbol "○" indicating that the standard deviation ratio is higher is inserted into the standard deviation ratio determination column 29h of the corresponding row.

In step S214, the computation unit 21 specifies the data index having a high correlation, a high coefficient of variation, and a high standard deviation ratio as a data index used in the prediction model and stores the light intensity monitoring value of the corresponding data index in the monitoring data table 210a. The computation unit 21 specifies the row marked with the symbol "○" indicating that each of the values of the coefficient-of-variation determination column 29g and the standard deviation ratio determination column 29h of the correlation/deviation data table 29a is high, and inserts the symbol "○" indicating the data index used in the prediction model into the corresponding row of the selection data index column 29i.

Note that, although a plurality of data indices are selected according to this embodiment, a row having the greatest absolute value of the correlation coefficient out of the rows marked as "○" in the coefficient-of-variation determination column 29g and the standard deviation ratio determination column 29h may be specified as the data index used in the prediction model if the prediction model is created through a simple linear regression using a single data index in the prediction model creation process (step S215) described below. Furthermore, the computation unit 21 duplicates information regarding the column corresponding to the data index used in the prediction model out of the light intensity monitoring value candidate columns 28c of the monitoring candidate data table 28a, that is, the data index for which the symbol "○" is stored in the selection data index column 29i into the light intensity monitoring value column 210c of the monitoring candidate data table 28a.

In step S215, the computation unit 21 creates the prediction model expressed as the following Equation (4) using the light intensity monitoring value of the selected data index.

[Equation 4]

$$y = b + \sum_{i=1}^{l} a_i x_i \quad (4)$$

In Equation (4), reference symbol "y" denotes a prediction value of the processing result factor. Reference symbol "b" denotes a constant term (intercept). Reference symbol "$x_i$" denotes the light intensity monitoring value of the selected data index. Reference symbol "$a_i$" denotes a coefficient applied to the light intensity monitoring value of the selected data index. Reference symbol "l" denotes the number of the selected data indices. Reference symbol "Σ" denotes a summation of the product of the light intensity monitoring value and the coefficient throughout the selected data indices. Since Equation (4) has a general linear regression format, the constant term and the coefficient can be computed on the basis of the partial least-squares method or the least-squares method discussed in JP-2007-250902-A. When the least-squares method is employed, the constant term "b" and the coefficient "$a_i$" can be obtained using the following Equations (5), (6), (7), (8), and (9).

[Equation 5]
$$A = (X'X)^{-1} X'y \quad (5)$$

[Equation 6]
$$A = \begin{bmatrix} a_0 \\ a_1 \\ \vdots \\ a_l \end{bmatrix} \quad (6)$$

[Equation 7]
$$X = \begin{bmatrix} 1 & x_{11} - mx_1 & \cdots & x_{1l} - mx_l \\ \vdots & \vdots & \ddots & \vdots \\ 1 & x_{n1} - mx_1 & \cdots & x_{nl} - mx_l \end{bmatrix} \quad (7)$$

[Equation 8]
$$Y = \begin{bmatrix} y_1 \\ \vdots \\ y_n \end{bmatrix} \quad (8)$$

[Equation 9]
$$b = a_0 - \sum_{i=1}^{l} a_i mx_i \quad (9)$$

In the equations described above, reference symbol "A" denotes a matrix including "$a_0$" serving as a source of the constant term (intercept) "b" and the coefficient "$a_i$" (where i=1, . . . , l). Reference symbol "X" denotes a matrix including the values "$x_{jk}$" (where j=1, . . . , n, and k=1, . . . , l) stored in the light intensity monitoring value column 210c of the monitoring data table 210a and 1. Reference symbol "$x_{jk}$" denotes a light intensity monitoring value of the (k)th data index (the (k)th column) and the (j)th wafer ID (the (j)th row) of the light intensity monitoring value column 210c. Reference symbol "$mx_k$" denotes an average value in the row direction of the light intensity monitoring value stored in the (k)th data index (the (k)th column) of the light intensity monitoring value column 210c. Reference symbol "Y" denotes a matrix including values "$y_j$" (where j=1, . . . , n) stored in the processing result factor column 24c of the processing result factor data table 24a. Reference symbol "$y_j$" denotes a processing result factor of the (j)th wafer ID (the (j)th row) of the processing result factor column 24c.

Note that, when a mutual correlation of the light intensity monitoring value between the data indices selected before computation of the coefficient "$a_i$" using Equation (5) is high, the computation may be performed by deleting any one of the data indices. The computation unit 21 stores the data index used in the prediction model in the prediction model data index column 211c of the prediction model data table 211a, stores the constant term of the created prediction model in the constant term column 211b, and stores the coefficient by matching with the prediction model data index column 211c of the coefficient column 211d.

In step S216, the computation unit 21 outputs the prediction model created as a result of the analysis process on the screen and terminates the process. An example of the output screen shown to an apparatus manager from the computation unit 21 is illustrated in FIG. 17. On the output screen of FIG. 17, information on the prediction model stored in the prediction model data table 211a is displayed as a table D201. If the apparatus manager performs the APC using this prediction model, the button "YES" D202 is clicked. As the click is performed, the computation unit 21 stores a copy of the prediction model in the memory unit 14 of the plasma processing unit 10, outputs an APC execution command to the control unit 13, and terminates the analysis process.

If the apparatus manager does not use this prediction model, the button "NO" D203 is clicked, and computation unit 21 terminates the analysis process. In addition, the information stored in the correlation/deviation data table 29a is displayed as a table D204. The apparatus manager may refer to the information such as the correlation or the deviation for the data index used in the prediction model and the data index candidate used in the prediction model.

Next, selection of the data index based on the "deviation" will be described. The meaning of the selection of the data index using the coefficient of variation and the standard deviation ratio performed by the computation unit 21 will be described with reference to FIGS. 18A, 18B, 19A, and 19B.

Figure 18A:
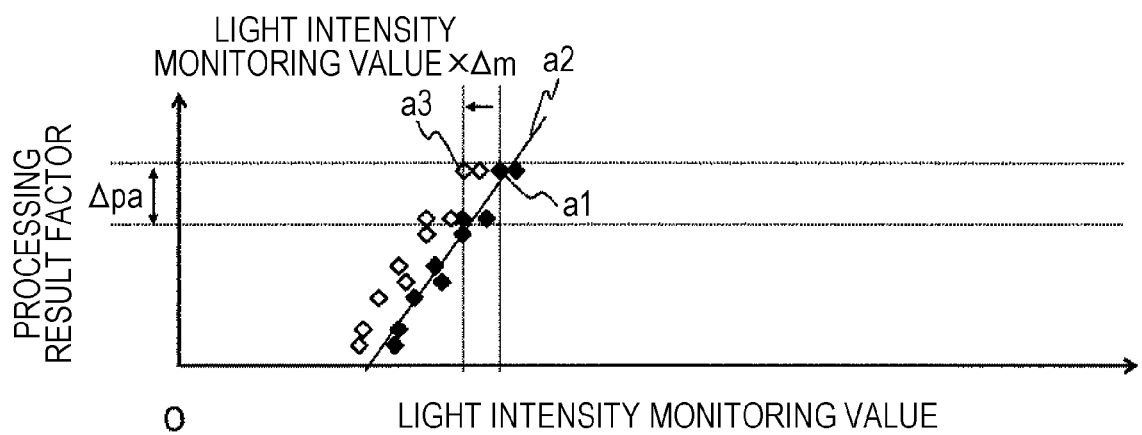
FIG. 18A is a scatter plot illustrating distributions of the light intensity monitoring value and the processing result factor for a data index having a high coefficient of variation.
Figure 18B:
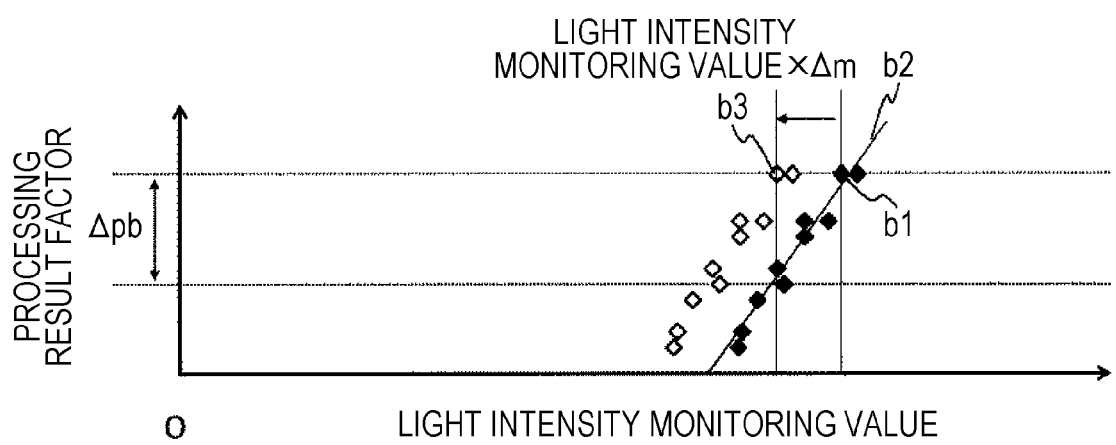
FIG. 18B is a scatter plot illustrating distributions of the light intensity monitoring value and the processing result factor for a data index having a low coefficient of variation.

First, the meaning of selection of the coefficient of variation will be described with reference to FIGS. 18A and 18B. FIGS. 18A and 18B are scatter plots in which the abscissa indicates the light intensity monitoring value, and the ordinate indicates the processing result factor. FIG. 18A shows an example of the data index having a high coefficient of variation, and FIG. 18B shows an example of the data index having a low coefficient of variation. Each of points a1 and a3 of FIG. 18A and b1 and b3 of FIG. 18B indicates the measurement value of each wafer. The points a1 and b1 indicate examples of the light intensity monitoring value and the processing result factor obtained before the prediction model is created. In addition, the points a3 and b3 indicate examples of the light intensity monitoring value and the processing result factor obtained newly when the APC is performed after creation of the prediction model. Each point such as "a3" and "b3" are obtained by reducing the light intensity monitoring value from each point such as "a1" and "b1" by the same rate (Δm) This means that the light intensity monitoring value is reduced at a constant rate due to clouding on a measurement window adjoining with the spectroscope. If the prediction model of the processing result factor is created using the point a1, a function expressing the straight line a2 as a straight line having the minimum distance from each point is created. Similarly, if the prediction model is created using the point b1, a function indicating the straight line b2 is created.

When the processing result factor is predicted from the light intensity monitoring value for the data on the points a3 and b3 using the prediction model of the line a2 or b2, an error is generated in the prediction of the processing result factor as the light intensity monitoring value is reduced. In this case, the error is expressed as "Δpa" and "Δpb," where Δpa is smaller than Δpb. By creating the prediction model using the data index having a high coefficient of variation, it is possible to create a prediction model having robustness, that is, the error is small against reduction (or increase) of the light intensity monitoring value caused by clouding on the measurement window. Next, the meaning of selection of the data index based on the standard deviation ratio will be described with reference to FIGS. 19A and 19B.

Figure 19A:
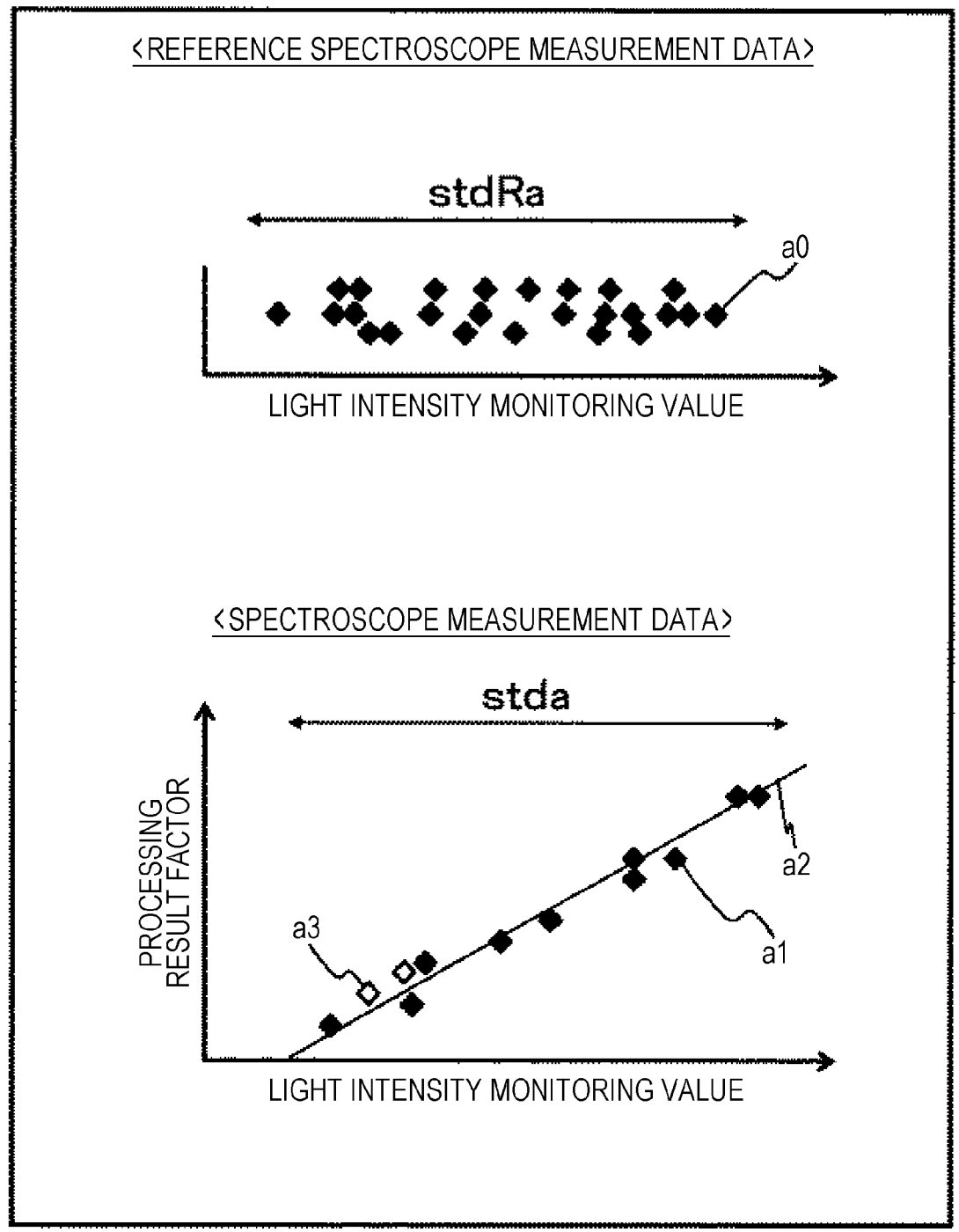
FIG. 19A is a scatter plot illustrating distributions of the light intensity monitoring value and the processing result factor for a data index having a high standard deviation ratio.
Figure 19B:
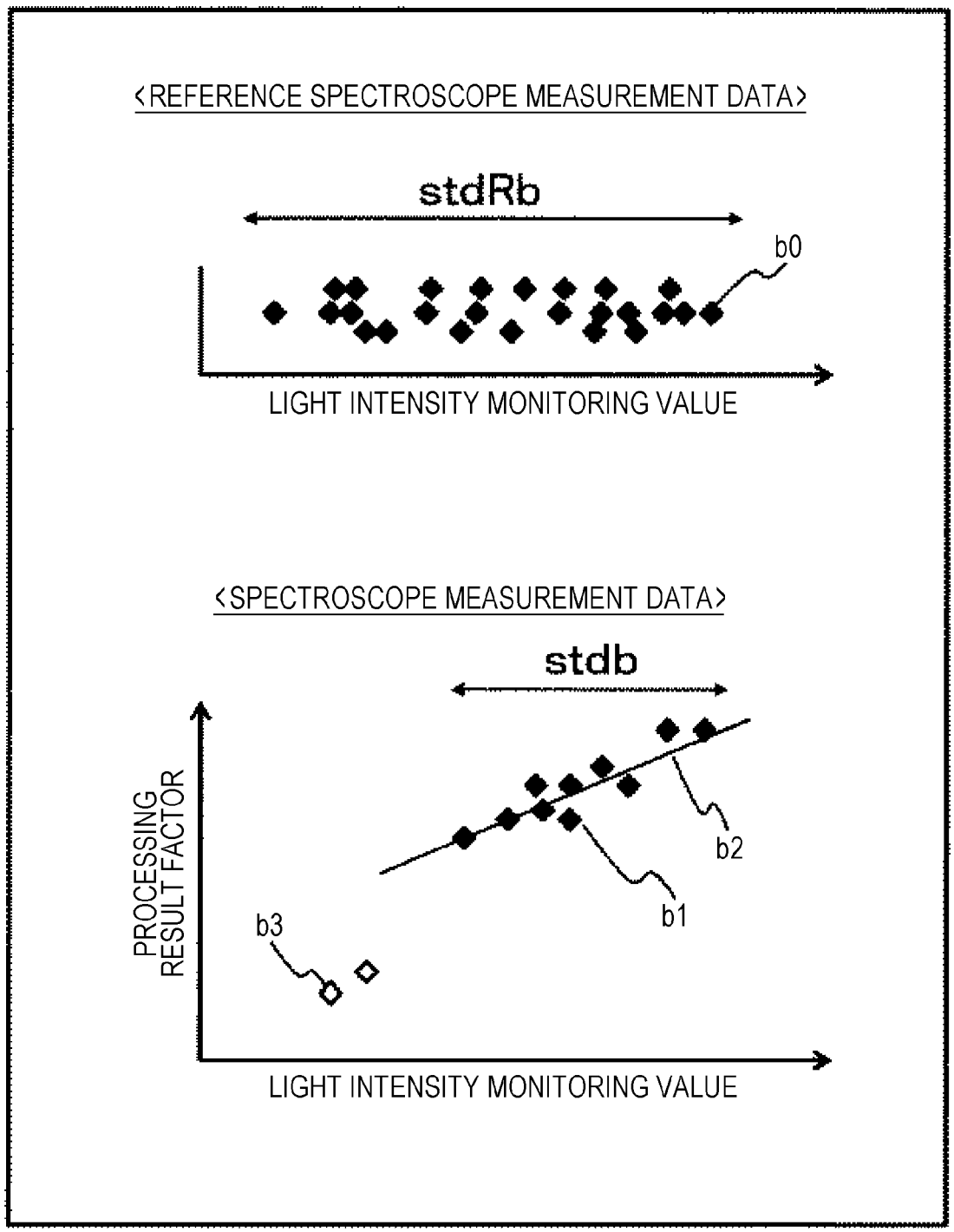
FIG. 19B is a scatter plot illustrating distributions of the light intensity monitoring value and the processing result factor for a data index having a low standard deviation ratio.

The graphs illustrated in the upper halves of FIGS. 19A and 19B are scatter plots in which the abscissa denotes the light intensity monitoring value of the reference spectroscope measurement data, and the graphs illustrated in the lower halves are scatter plots in which the abscissa denotes the light intensity monitoring value, and the ordinate denotes the processing result factor. FIG. 19A illustrates an example of the data index having a high standard deviation ratio, and FIG. 19B illustrates an example of the data index having a low standard deviation ratio. Each point such as "a0" and "b0" in FIG. 19A indicates the measurement value of each wafer of the reference spectroscope measurement data, and the deviations are expressed as "stdRa" and "stdRb."

Each point such as "a1" and "a3" of FIG. 19A and "b1" and "b3" of FIG. 19B indicates the measurement value of each wafer. The points a1 and b1 indicate examples of the light intensity monitoring value and the processing result factor obtained before creation of the prediction model. The points a3 and b3 indicate examples of the light intensity monitoring value and the processing result factor obtained newly when the APC is performed after creation of the prediction model. The deviations of the points a1 and b1 are denoted by "stda" and "stdb," respectively.

If the prediction model of the processing result factor is created using the point a1, a function expressing the straight line a2 as a straight line having the minimum distance from each point is created. Similarly, if the prediction model is created using the point b1, a function expressing the straight line b2 is created.

Compared to a case where the standard deviation ratio is high, if the standard deviation ratio is low, a distribution of the light intensity monitoring value is highly likely to be deviated relative to a distribution of the data (b1) used in creation of the prediction model. For this reason, when the APC is performed, a new light intensity monitoring value is highly likely to be measured outside a distribution range of the light intensity monitoring value of the point b1 as illustrated as the point b3. If data is spread out of the distribution range, the prediction model is expanded (extrapolated) out of the data measurement range, and thus, an error is easily spread out. By creating the prediction model using the data index having a high standard deviation ratio, it is possible to reduce a possibility of generating an error caused by extrapolation.

As described above, as illustrated in FIGS. 18 and 19, by selecting the data index having a high coefficient of variation and a high standard deviation ratio, it is possible to create the prediction model having robustness. The reason will be described as follows.

In a typical mass production, for example, the light intensity value may be significantly deviated due to aging or the like. Meanwhile, if the prediction model is created for a wavelength of the emitted light having a small deviation of the light intensity value, it becomes difficult to predict the processing result factor in the case of an irregular light intensity value of the mass production data and the light intensity value of the mass production data out of a deviation range of the light intensity value in creation of the prediction model using the prediction model created as described above. For this reason, in order to create the robust prediction model, it is necessary to create the prediction model by selecting the data index having a high coefficient of variation and a high standard deviation ratio.

As described above, according to an embodiment of the present invention, a data analysis method using data obtained from a plasma processing apparatus includes obtaining spectroscope measurement data representing light intensities at a plurality of wavelengths obtained during plasma processing and processing result factor data representing a dimension of a plasma-processed semiconductor wafer or a processing speed, computing a correlation coefficient between the light intensity and the processing result factor data for a data index as a wavelength or a combination of wavelengths of the spectroscope measurement data, a coefficient of variation or standard deviation ratio representing a deviation of the light intensity, specifying a data index having a high correlation coefficient and a high coefficient of variation or standard deviation ratio, and creating a prediction model for predicting the processing result factor using the light intensity of the data index. In addition, this method is applied to a plasma processing apparatus.

Note that, without limiting to the plasma processing apparatus, the present invention may also be applied to a plasma processing method using the plasma processing apparatus according to the present invention, and an analysis device and analysis method for performing data analysis according to an embodiment of the present invention.

As described above, using the analysis method executed by the plasma processing apparatus 1 (analysis unit 20) according to an embodiment of the present invention, it is possible to create a prediction model by specifying a data index capable of holding high accuracy in prediction of the processing result factor.

According to an embodiment of the present invention, it is possible to appropriately obtain the data index (wavelength or a combination of wavelengths) for computing the light intensity monitoring value from the spectroscope measurement data. As a result, it is possible to predict the processing result factor with high accuracy and control the processing result factor within a smaller deviation.

According to an embodiment of the present invention, by selecting a wavelength having a high coefficient of variation, it is possible to reduce degradation of the prediction accuracy caused by a change of the light intensity. In addition, by selecting a wavelength having a high standard deviation ratio, it is possible to reduce degradation of the prediction accuracy caused by extrapolation of the prediction model. Due to both the effects, it is possible to select a data index capable of holding high prediction accuracy and predict the processing result factor.

While embodiments of the present invention have been described specifically, it would be appreciated that these embodiments are just for illustrative purposes and are not intended to limit the scope of the invention. Various changes, modifications, or substitutions may also be possible without departing from the scope and spirit of the invention.

What is claimed is:

1. An analysis method for analyzing data on light emitted from plasma, comprising:
a group of steps of:
obtaining wavelengths of the light correlated with a plasma processing result;
selecting, from the obtained wavelengths, a wavelength selected such that a first factor is larger than a first predetermined value, the first factor representing a deviation in an intensity distribution of the light;
obtaining a prediction formula to predict the plasma processing result, based on the selected wavelength; and
predicting the plasma, processing result using the selected wavelength.

2. The analysis method according to claim 1, wherein the first predetermined value is a value defined to allow a prediction error of a prediction formula for predicting the plasma processing result to be an allowable value.

3. The analysis method according to claim 1, wherein the first factor is obtained using a standard deviation or a square of the standard deviation.

4. The analysis method according to claim 1, wherein the first factor is a ratio between the standard deviations obtained from a pair of different groups of plasma processing samples.

5. The analysis method according to claim 1, wherein the first factor includes a value obtained by dividing a standard deviation by an average value of the light intensity and a ratio of the standard deviations obtained from a pair of different groups of plasma processing samples.

6. An analysis method for analyzing data on light emitted from plasma, comprising:
   a group of steps of:
   obtaining values computed using each of light intensities of a plurality of wavelengths and correlated with the plasma processing result;
   selecting, from the obtained values, a value selected such that a factor is larger than a predetermined value, the factor representing a deviation in a distribution of the obtained values;
   obtaining a prediction formula to predict the plasma processing result based on the selected value; and
   predicting the plasma processing result using the selected value.

* * * * *